United States Patent [19]

Heigl

[11] Patent Number: 4,651,090
[45] Date of Patent: Mar. 17, 1987

[54] DEVICE FOR RECEIVING COMPONENTS, PARTICULARLY INTEGRATED CHIPS, IN AN INPUT AND/OR OUTPUT MAGAZINE OF A COMPONENT TESTING MACHINE

[75] Inventor: Helmut Heigl, Kolbermoor, Fed. Rep. of Germany

[73] Assignee: Multitest Elektronische Systeme GmbH, Rosenheim, Fed. Rep. of Germany

[21] Appl. No.: 808,389

[22] Filed: Dec. 17, 1985

Related U.S. Application Data

[63] Continuation of Ser. No. 666,948, Oct. 29, 1984, abandoned.

[30] Foreign Application Priority Data

Nov. 7, 1983 [DE] Fed. Rep. of Germany ....... 3340185

[51] Int. Cl.4 ............................................. G01R 31/28
[52] U.S. Cl. ............................ 324/158 F; 324/73 PC
[58] Field of Search ............. 73/432 V, 432 R, 432 Z; 324/73 PC, 73 R, 73 AT, 158 F

[56] References Cited

U.S. PATENT DOCUMENTS

| | | | |
|---|---|---|---|
| 3,677,401 | 7/1972 | Chaparro et al. | 209/73 |
| 3,701,021 | 10/1972 | Isaac et al. | 324/158 F |
| 3,716,786 | 2/1973 | Gearin | 324/158 F |
| 3,824,462 | 7/1974 | Vinsani | 324/73 PC |
| 3,896,935 | 7/1975 | Hjelle et al. | 209/73 |
| 4,234,418 | 11/1980 | Boissicat | 209/542 |
| 4,478,352 | 10/1984 | Amundson et al. | 221/13 |
| 4,488,354 | 12/1984 | Chan et al. | 324/73 PC X |
| 4,510,806 | 4/1985 | Janisiewicz et al. | 73/432 R |

OTHER PUBLICATIONS

"Module Test and Handling System"; *IBM Technical Disclosure Bulletin;* vol. 16, No. 11, pp. 3653-3654; L. D. House; Apr. 1974.

Primary Examiner—Stewart J. Levy
Assistant Examiner—Tom Noland
Attorney, Agent, or Firm—Fitzpatrick, Cella, Harper & Scinto

[57] ABSTRACT

In a device for receiving components (8', 8", 8'''), particularly integrated chips, in receiving portions (15, 19, 20, 21, 22) of an input and/or output magazine of a component testing machine, with a testing device, the receiving portions are formed by providing grooves for each portion, in a support plate (14), at a distance corresponding to the varying distance between connections of the components to be received.

6 Claims, 7 Drawing Figures

DEVICE FOR RECEIVING COMPONENTS, PARTICULARLY INTEGRATED CHIPS, IN AN INPUT AND/OR OUTPUT MAGAZINE OF A COMPONENT TESTING MACHINE

This application is a continuation of application Ser. No. 666,948 filed Oct. 29, 1984, now abandoned.

TECHNICAL FIELD OF THE INVENTION

The invention relates to a device for receiving components, particularly integrated chips, in receiving portions of an input and/or output magazine of a component testing machine, in which a testing device, arranged behind the input magazine or in front of the output magazine, enables the individual components to be tested consecutively, and to be discharged after the test.

BRIEF DESCRIPTION OF THE PRIOR ART

A device of the type described above is generally already known (No. EP-A1-7650). One disadvantage of the known device in question is that it is only capable of processing components of a single size. If components of different sizes, i.e. components whose electrical connections are not equidistant from one another, are to be processed, the known device in question must first be converted at considerable expense.

OBJECT OF THE INVENTION

The fundamental object of the invention is therefore to demonstrate a method of processing components of different sizes, i.e. components with electrical connections which are not equidistant from one another, this method being relatively simple and not involving any appreciable conversion expenditure.

SUMMARY OF THE INVENTION

The object just described is achieved according to the invention, in a device of the type already mentioned, in that the receiving portions of the input magazine and/or of the output magazine are formed by providing grooves, for each receiving portion, in a support plate at a distance which corresponds to the varying distance between the connections of the components to be received.

The invention has the advantage that a method can be found of processing components of different dimensions, whose component connections are not equidistant from each other, in the input or output magazine, without incurring any conversion cost.

Two separate grooves are suitably provided on either side of each receiving portion, thereby affording the advantage that components with a maximum of four different distances between the component connections can be processed by relatively simple means.

However, the grooves are suitably provided centrally and symmetrically on both sides of each receiving portion, which affords the advantage of an extremely low product cost.

Separate insertion masks, with dimensions corresponding to the distance between the connections of the components concerned, should preferably be provided for introducing the components into the appropriate magazine. This has the advantage that the components concerned can be inserted by simple means into the appropriate magazine receiving portions.

In order to minimise the conversion time when processing components of different sizes, whose electrical connections are by no means equidistant from each other, the above-mentioned testing device is replaceable, at least as far as the test range covering the components exhibiting different dimensions is concerned. The test device in question may suitably be designed so that its test area or range enables its probes to be presented to the electrical connections of all the components brought to it. In this manner the object is achieved without having to replace individual parts of the testing device concerned.

The testing device in question is suitably provided with a component turning device, which measure is used to advantage when the components to be processed are to remain in the same position both on the input side of the testing device, and on its output side. This is particularly true when both an input magazine and an output magazine are to be used, and the components to be tested are conveyed on an arched track from top to bottom.

The invention is illustrated in greater detail below, in an embodiment explained with reference to drawings.

DETAILED DESCRIPTION OF THE PREFERRED EMBODIMENT

Figure 1:
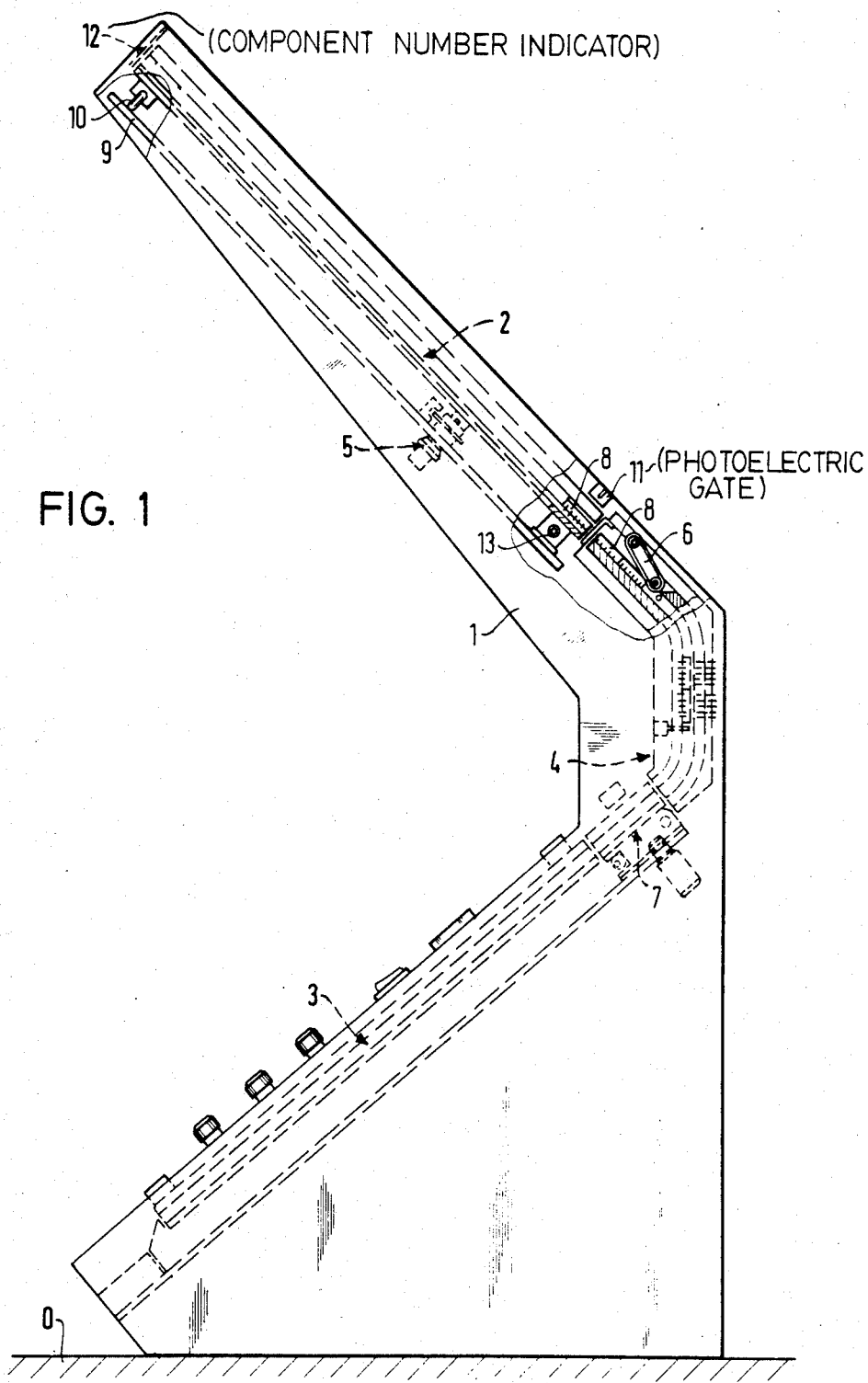
FIG. 1 shows diagrammatically, on a reduced scale, a side view of a machine used for receiving and testing components, in which the device according to the invention is used.

A machine 1, used for receiving and testing components, is represented diagrammatically in FIG. 1. The components concerned are in this particular case integrated chips 8, some of which are indicated in FIG. 1.

Machine 1, standing on a floor 0, exhibits in its upper region an obliquely positioned input magazine 2, and in its lower region an obliquely positioned output magazine 3. Between input magazine 2 and output magazine 3 is provided a testing device 4, in which the individual components 8, discharged from input magazine 2, can be tested, and from which the tested components can be discharged to output magzine 3.

Input magazine 2 may be displaced along a support bar 13, which is secured to a baseplate 9. At a certain distance from support bar 13, input magazine 2 has at least one runner 10 enabling it to run along baseplate 9 when displaced.

A conveyor device 5, which is secured to baseplate 9, is used to displace input magazine 2 in the longitudinal direction of support bar 13.

A sorting device 6 in the inlet area of testing device 4 is indicated in FIG. 1. This sorting device 6 is used to convey components 8 supplied to it from input magazine 2 into a testing or measuring area of testing device 4, individually and consecutively. In the region of input magazine 2, devices may suitably be provided which bring the area in question, and hence the components in it, to a desired temperature. Such devices will normally be heating devices.

As FIG. 1 indicates, a further conveyor device 7 is provided between testing device 4 and output magazine 3. The purpose of this conveyor device 7 is to convey components fed to it from testing device 4 to output magazine 3.

In addition to the elements considered above, the machine shown diagrammatically in FIG. 1 has a further fixed photoelectric gating device, at the bottom of input magazine 2, denoted generally by 11, and indicating device 12, also fixed, at the top of said input magazine 2. The movement of the individual components 8 from input magazine 2 into testing device 4 is determined by means of photoelectric device 11. Indicating devices 12 indicate the number of components 8 in the individual receiving portions of input magazine 2.

Figure 2:
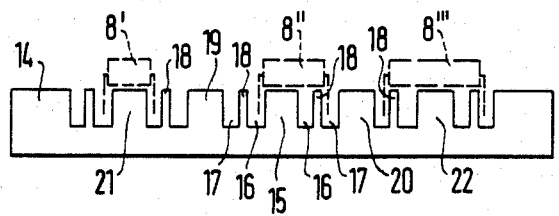
FIG. 2 shows, in a diagrammatic front view, the profile of an input and/or output magazine used in the machine according to FIG. 1.
Figure 3:
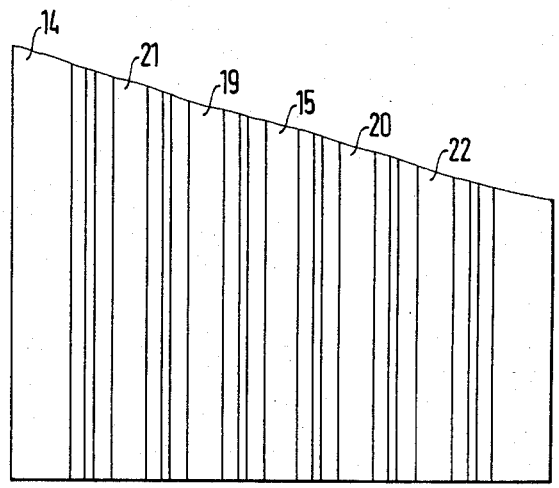
FIG. 3 shows, in a section, an elevation of the profile shown in FIG. 2.

FIGS. 2 and 3 show diagrammatically a profile section 14 which can be used in input magazine 2 and/or in output magazine 3, according to FIG. 1, for receiving components. As FIG. 2 clearly shows, profile section 14, formed by a support plate, exhibits a number of component receiving portions denoted by 15, 19, 20, 21 and 22 respectively. Every such component receiving portion is formed by a web section of a certain width. On both sides of each such web (strut) section are provided two separate grooves 16, 17, as illustrated in greater detail with reference to web (strut) section 15. The two grooves provided on each side are separated by a web or strut 18. Moreover, the device is designed so that grooves 16, 17 are formed symmetrically in relation to each web (strut) section, such as web (strut) section 18.

In the case of the profile section shown in FIG. 2, grooves 16, 17 provided on both sides of web (strut) sections 15, 19, 20, are identical to grooves provided for the adjacent web (strut) section. Thus only the two grooves 16, 17 shown in FIG. 2 are provided on the sides of the two web (strut) sections 15 and 19 facing each other, which grooves are separated by a thin web (strut) section 18.

The distance between grooves 16, 17 associated with the appropriate component receiving portion is chosen so that it corresponds to the distance between the connections of the components denoted in Fig. by 8', 8" and 8'". As can be seen in FIG. 2, components with three different distances between their connections can be processed with the configuration of grooves 16, 17 chosen.

Figure 4:
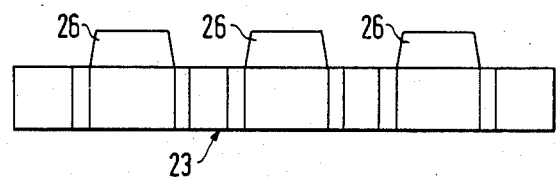
FIGS. 4, 5 and 6 show, diagrammatically, insertion masks which may be used in conjunction with the profile according to FIGS. 2 and 3.
Figure 5:
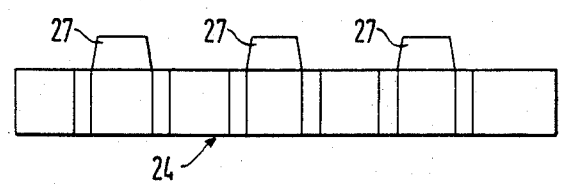
Figure 6:
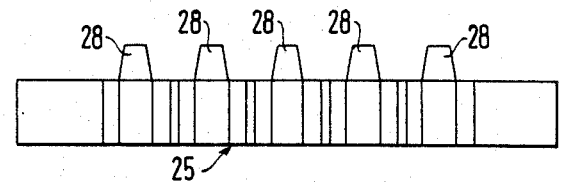

FIGS. 4, 5 and 6 show separate insertion masks 23, 24 and 25, respectively, by means of which components 8', 8" and 8'" shown in FIG. 2 may be inserted in the appropriate magazine with profile section 14 shown in FIGS. 2 and 3. Insertion mask 23 has strut sections 26, projecting from a support plate, which sections are dimensioned so that they are able to receive components corresponding to component 8'" shown in FIG. 2. Insertion mask 24 has strut sections 27, projecting from a support plate, which sections are dimensioned so that they are able to receive components corresponding to component 8" shown in FIG. 2. Finally, insertion mask 25 has strut sections 28, projecting from a support plate, which sections are dimensioned so that they are able to receive components according to component 8' shown in FIG. 2.

Insertion masks 23, 24, 25 shown in FIGS. 4 to 6 are used as replaceable masks in conjunction with the appropriate components.

Figure 7:
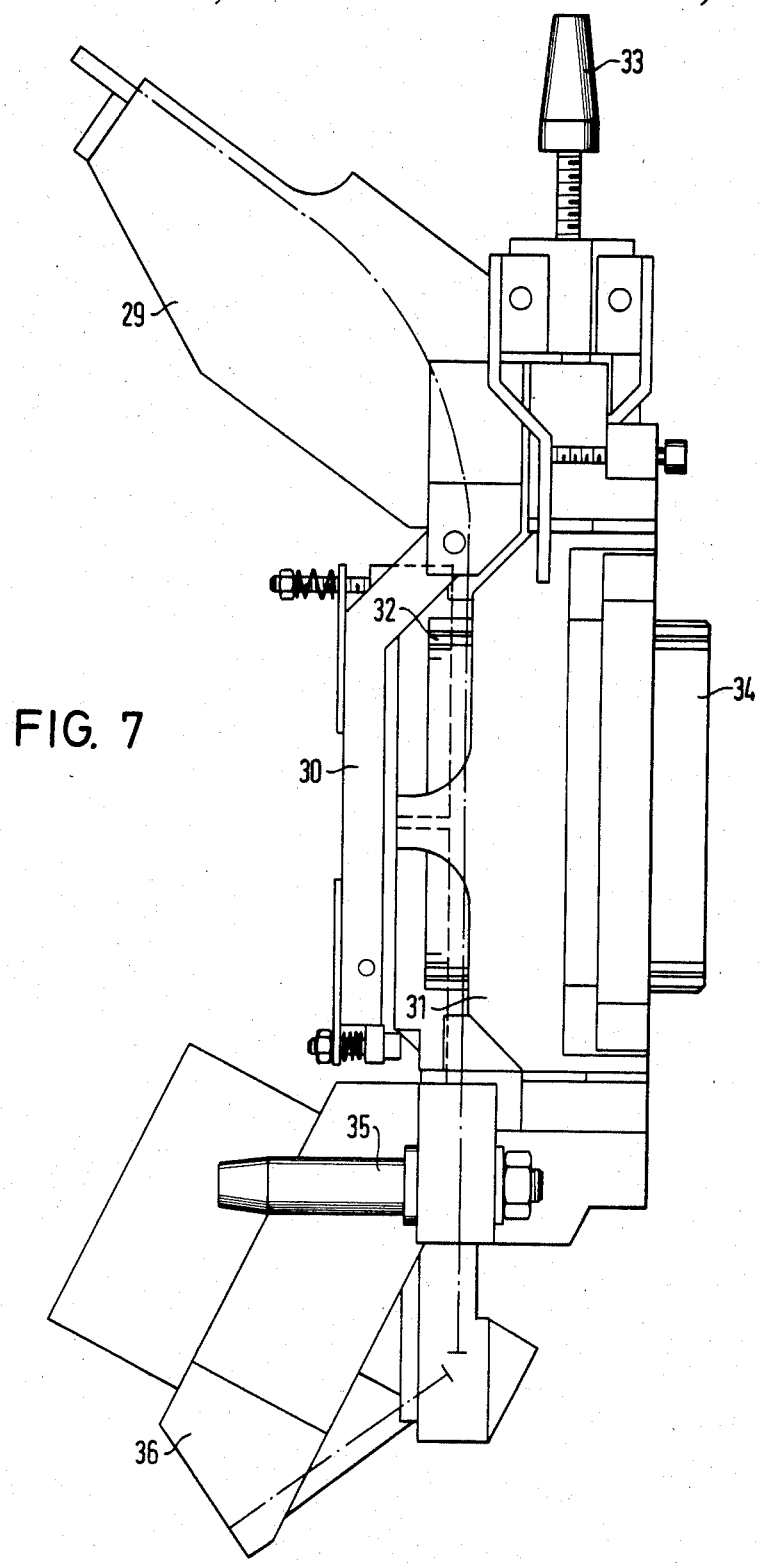
FIG. 7 shows, in an enlarged representation, a testing device which can be used in the machine according to FIG. 1.

FIG. 7 illustrates a replaceable testing device which can be used in the machine shown in FIG. 1. The testing device shown in FIG. 7 comprises, in its upper region, a curved section 29, which enables the individual components discharged from input magazine 2, shown in FIG. 1, to be received on a curved track, denoted IC track, and to be inserted in a measuring area. This measuring area is located in the central section of the device shown in FIG. 7. In this area the component in question is retained in a measuring position by means of contact pressure mechanism 30. Measuring sensors or detectors can be pushed on to the electrical connections of the component to be tested by means of contact pressure mechanism 31 with contact springs.

FIG. 7 shows contact springs 32 and 34, which can be connected to plug connectors of measuring and evaluating devices.

At the top, the device shown in FIG. 7 exhibits an adjusting device 33 having a stopper in the said testing device which can be vertically adjusted.

At the bottom, FIG. 7 shows a centering pin 35, which is important for centering the said testing device in the machine shown in FIG. 1.

Finally, the testing device shown in FIG. 7 also exhibits a component turning device 36, which ensures that components leaving the said testing device can be received by output magazine 3 shown in FIG. 1, in the manner illustrated with reference to FIG. 2.

In conclusion it should be noted that the object of the invention can in principle be achieved even without a component turning device in the testing device if the input magazine and output magazine in the machine shown in FIG. 1 lie in practice in one and the same plane.

What is claimed is:

1. A component receiving device for a component testing machine, said component receiving device comprising a magazine arranged adjacent a testing device in a manner to enable individual components to be tested consecutively and to be discharged consecutively after testing, said magazine having receiving portions formed by a plurality of parallel grooves spaced apart from each other at various distances corresponding to the various distances between component connections of components to be received in the magazine.

2. A device according to claim 1 wherein each receiving portion comprises a central web with at least two grooves extending along each side of the central web.

3. A device according to claim 1 wherein each receiving portion comprises a central web with grooves arranged symmetrically on both sides of the web.

4. A device according to claim 1 wherein said magazine includes at least one insertion mask dimensioned according to a distance between the connections of components to be received in the magazine for introducing the components into appropriate receiving portions of the magazine.

5. A device according to claim 1 wherein said testing device is replaceable for accommodating components having different dimensions if a set of components having a different distance between component connections is to be tested.

6. A device according to claim 1 wherein the testing device includes a component turning device.

* * * * *